(12) United States Patent
Kida et al.

(10) Patent No.: US 9,690,439 B2
(45) Date of Patent: Jun. 27, 2017

(54) TOUCH PANEL

(71) Applicant: Sharp Kabushiki Kaisha, Osaka-shi, Osaka (JP)

(72) Inventors: Kazutoshi Kida, Osaka (JP); Shogo Hayashi, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 133 days.

(21) Appl. No.: 14/431,331

(22) PCT Filed: May 17, 2013

(86) PCT No.: PCT/JP2013/063812
§ 371 (c)(1),
(2) Date: Mar. 26, 2015

(87) PCT Pub. No.: WO2014/050202
PCT Pub. Date: Apr. 3, 2014

(65) Prior Publication Data
US 2015/0242027 A1    Aug. 27, 2015

(30) Foreign Application Priority Data
Sep. 27, 2012   (JP) ................ 2012-214307

(51) Int. Cl.
G06F 3/047   (2006.01)
G06F 3/041   (2006.01)
G06F 3/044   (2006.01)
G09G 5/00    (2006.01)

(52) U.S. Cl.
CPC ............. *G06F 3/047* (2013.01); *G06F 3/044* (2013.01); *G06F 3/0418* (2013.01); *G09G 5/003* (2013.01); *G09G 2300/0426* (2013.01); *H05K 2201/052* (2013.01); *H05K 2201/09781* (2013.01); *H05K 2201/10128* (2013.01)

(58) Field of Classification Search
CPC .......... G06F 3/041–3/047; H05K 2201/09781; H05K 1/0216–1/0236
USPC ................ 178/18.01–19.07; 345/173–178
See application file for complete search history.

(56) References Cited

U.S. PATENT DOCUMENTS

| 2007/0079996 | A1* | 4/2007 | Lee ................. G06F 3/044 178/18.06 |
| 2012/0038573 | A1 | 2/2012 | Kuang et al. |
| 2012/0326990 | A1* | 12/2012 | Wurzel ............. G06F 1/1658 345/173 |

FOREIGN PATENT DOCUMENTS

| JP | 2009-098834 A | 5/2009 |
| JP | 2012-123449 A | 6/2012 |
| JP | 2012-123850 A | 6/2012 |

* cited by examiner

Primary Examiner — Michael Pervan
(74) Attorney, Agent, or Firm — Keating & Bennett, LLP

(57) ABSTRACT

An arrangement is provided that uses the differential approach to effectively remove noise contained in a signal in a line even in a touch panel that includes some lines that are separated from each other at a larger distance. The touch panel (2) includes: a touch panel substrate (22), a plurality of Y-direction electrodes (23) provided on the touch panel substrate (22); a plurality of lines (24, 34) electrically connected with the Y-direction electrodes (23); and a floating electrode (61) located within a predetermined distance from at least one of the lines (24, 34) and another line adjacent the at least one line such that noise produced in the at least one line can be propagated to reach the other line.

4 Claims, 8 Drawing Sheets

TOUCH PANEL

TECHNICAL FIELD

The present invention relates to a touch panel that can determine a touch position on the operation surface.

BACKGROUND ART

Touch panels that can determine the position at which a stylus or finger touches the operation surface, i.e. a touch position, are known. As disclosed in JP 2012-123850 A, for example, such a touch panel includes two types of electrodes extending in different directions, where one group of electrodes straddle the other group of electrodes. That is, each of the electrodes of the one group has first portions that each straddle an electrode of the other group.

JP 2012-123850 A discloses a shielding conductive film located in the same layer as the first portions of the electrodes of the one group. This conductive film covers the electrodes of the two types in plan view. This conductive film may be electrically connected with a line of a reference potential, for example, to allow a certain signal to enter the conductive film, thereby reducing noise produced in the touch panel by a liquid crystal display panel placed over the touch panel.

DISCLOSURE OF THE INVENTION

A touch panel includes lead lines located outside the region of the touch electrodes and electrically connected with the touch electrodes. If the panel includes two types of electrodes extending in different directions, as in the arrangement of JP 2012-123850 A, such lead lines are each connected with the corresponding one of the electrodes, which means that the panel includes a large number of such lines. Typically, a touch panel is connected with an external control substrate or the like via connection lines and, for this purpose, the lead lines of each group are gathered at one location on the substrate of the touch panel. The location at which the lead lines of each group are gathered requires a space to accommodate all of these lead lines, resulting in a touch panel with a large picture frame region around the region of the electrodes. This means an increased size of the touch panel.

The lead lines of one group may be gathered at two or more separate locations on the substrate of the touch panel. In this case, each of the locations on the substrate at which these lead lines are gathered requires a smaller space for accommodating the lead lines, resulting in a touch panel with a smaller picture frame region. As the lead lines are gathered at two or more separate locations, some lead lines are separated from each other at a larger distance.

A signal that has been output by a touch panel may contain some noise due to external influence. To remove such noise, the difference between signals in two adjacent lead lines may be determined to remove noise contained in the signals in the lead lines. If this differential approach is to be used to remove noise, the distance between one lead line and an adjacent one must be constant such that a uniform level of noise is present in each lead line. However, if some lead lines are separated from each other at a larger distance, noise in these lead lines cannot be sufficiently removed by the differential approach.

An object of the present invention is to provide an arrangement that uses the differential approach to effectively remove noise contained in a signal transmitted via a line even in a touch panel that includes some lines that are separated from each other at a larger distance.

A touch panel according to an embodiment of the present invention includes: a substrate; a plurality of electrodes provided on the substrate; a plurality of lines each electrically connected with one of the plurality of electrodes; a controller configured to determine the difference between a signal provided by at least one line out of the plurality of lines and a signal provided by another line adjacent the at least one line out of the plurality of lines; and a floating electrode located within a predetermined distance from the at least one line and the other line and electrically independent from the plurality of lines such that noise produced in the at least one line can be propagated to reach the other line.

The touch panel according to an embodiment of the present invention uses the differential approach to effectively reduce noise contained in a signal transmitted via a line even if some lines are separated from each other at a larger distance.

EMBODIMENTS FOR CARRYING OUT THE INVENTION

Figure 1:
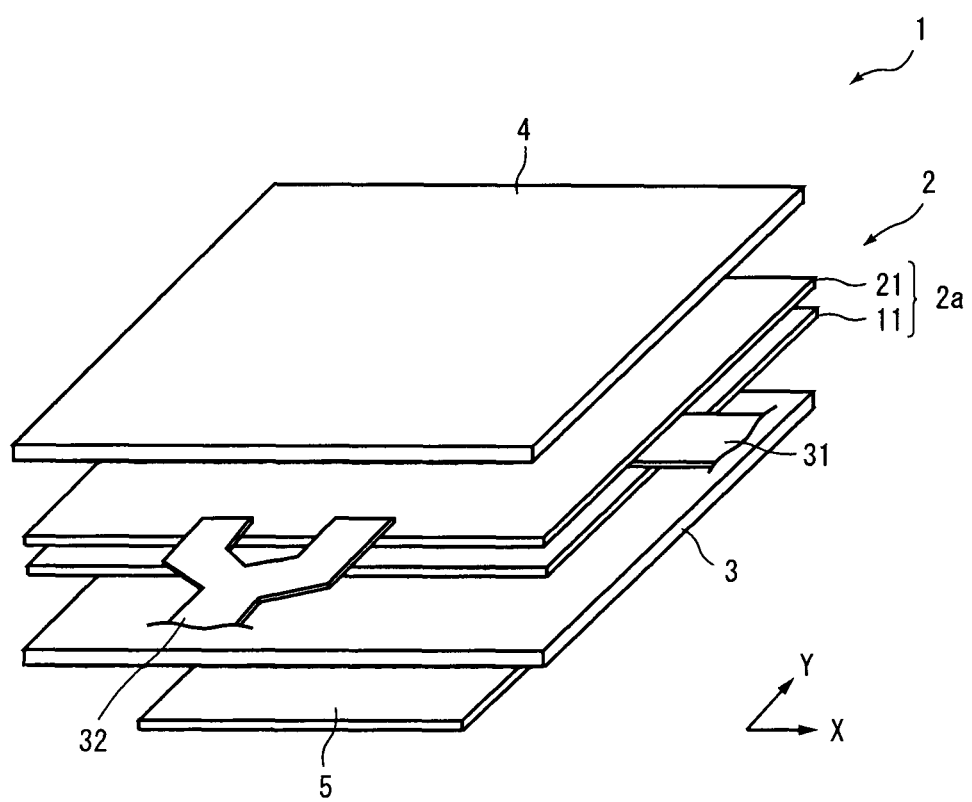
FIG. 1 is a schematic view of an entire touch panel-equipped liquid crystal display device including a touch panel according to an embodiment of the present invention.

A touch panel according to an embodiment of the present invention includes: a substrate; a plurality of electrodes provided on the substrate; a plurality of lines each electrically connected with one of the plurality of electrodes; a controller configured to determine the difference between a signal provided by at least one line out of the plurality of lines and a signal provided by another line adjacent the at least one line out of the plurality of lines; and a floating electrode located within a predetermined distance from the at least one line and the other line and electrically independent from the plurality of lines such that noise produced in the at least one line can be propagated to reach the other line (first arrangement).

Even when some lines connected with electrodes of the touch panel are separated from each other at a larger distance, the above arrangement allows noise in a line to be propagated via a floating electrode located close to the line to reach the adjacent line. Thus, the output signal of a line may be subtracted from that of the adjacent line to effectively remove noise contained in these signals.

As used herein, floating electrode means an electrode that is electrically independent from the lines and is in a state without any signal input. Predetermined distance means a distance that allows noise to be propagated between a line and the floating electrode.

Starting from the above first arrangement, the touch panel may further include a connecting portion configured to electrically connect the substrate with the controller. Each of the plurality of lines may include a substrate line provided on the substrate and electrically connected with one of the plurality of electrodes, a connection line provided on the connecting portion, and a controller line provided in the controller. The substrate line, the connection line and the controller line may be electrically connected. The floating electrode may be located within the predetermined distance from at least one line out of the substrate line, the connection line and the controller line, and another line adjacent the at least one line out of the plurality of lines (second arrangement).

Thus, where a floating electrode is provided, signal noise produced in a line may be propagated through the floating electrode to reach the next line. Thus, noise may be removed by the differential approach.

Starting from the above first or second arrangement, the floating electrode may be loop-shaped (third arrangement). This will further ensure that signal noise is propagated between two adjacent lines via the floating electrode.

Starting from the above third arrangement, the floating electrode may be located in the substrate, the connecting portion and the controller (fourth arrangement). Thus, signal noise may be propagated between two adjacent lines in the substrate, connecting portion and controller. This further ensures that the differential approach removes signal noise.

Starting from the above second arrangement, the floating electrode may be located to at least partly overlap at least one line out of the substrate line, the connection line and the controller line and another line adjacent the at least one line out of the plurality of lines, as viewed in a thickness direction of the substrate (fifth arrangement).

Thus, the parasitic capacitance formed by capacitive coupling between a line and the floating electrode is increased over that for an arrangement where the line and floating electrode are located in the same plane. This allows noise from a line to propagate through the floating electrode to reach the adjacent line more effectively.

Starting from the first arrangement, it is preferable that the floating electrode has the same width as the at least one line and the other line.

Further, starting from the first arrangement, it is preferable that the minimum distance between the floating electrode and the at least one line next to the floating electrode is substantially equal to the minimum distance between the floating electrode and the other line adjacent the floating electrode.

In these arrangements, the propagation characteristics for noise from a line with noise to the floating electrode are substantially the same as the propagation characteristics for noise from the floating electrode to the adjacent line.

Starting from the above second arrangement, it is preferable that the connection lines are divided into at least two line groups near their connection with the substrate and the floating electrode extends from the branch position of the line groups along the line groups.

Thus, a floating electrode extending from the branch position of line groups of connection lines along the line groups allows signal noise produced in one line group to propagate through the floating electrode to reach the other line group. Thus, even when two adjacent connection lines belong to different line groups and thus are separated from each other, signal noise produced in one connection line is propagated through the floating electrode to reach the other connection line.

Preferred embodiments of the touch panel will be described with reference to the drawings. The sizes of the components of the drawings do not exactly represent the sizes of actual components or the size ratios of the components.

Embodiment 1

FIG. 1 is a schematic view of a touch panel-equipped liquid crystal display device 1 (i.e. touch panel-equipped display device) including a touch panel 2 according to Embodiment 1. As shown in FIG. 1, in the touch panel-equipped liquid crystal display device 1, a panel body 2a of a touch panel 2 that can determine a touch position is placed over a liquid crystal panel 3 that can display an image. In FIG. 1, numeral 4 indicates a cover glass located on the side of the touch panel 2 that is opposite the one adjacent the liquid crystal panel 3 (i.e. the operation surface side or the viewer's side). Numeral 5 indicates a touch panel controller (i.e. controller) that constitutes part of the touch panel 2 and controls the operation of the panel body 2a. In FIG. 1, the backlight and other components stacked on the liquid crystal panel 3 are not shown.

Although not shown, the liquid crystal panel 3 includes an active-matrix substrate having a large number of pixels arranged in a matrix, a counter-substrate having a surface facing the active-matrix substrate, and a liquid crystal layer located between the active-matrix substrate and counter-substrate. The construction of the liquid crystal panel 3 is the same as that of conventional liquid crystal panels and thus will not be described in detail.

Figure 2:
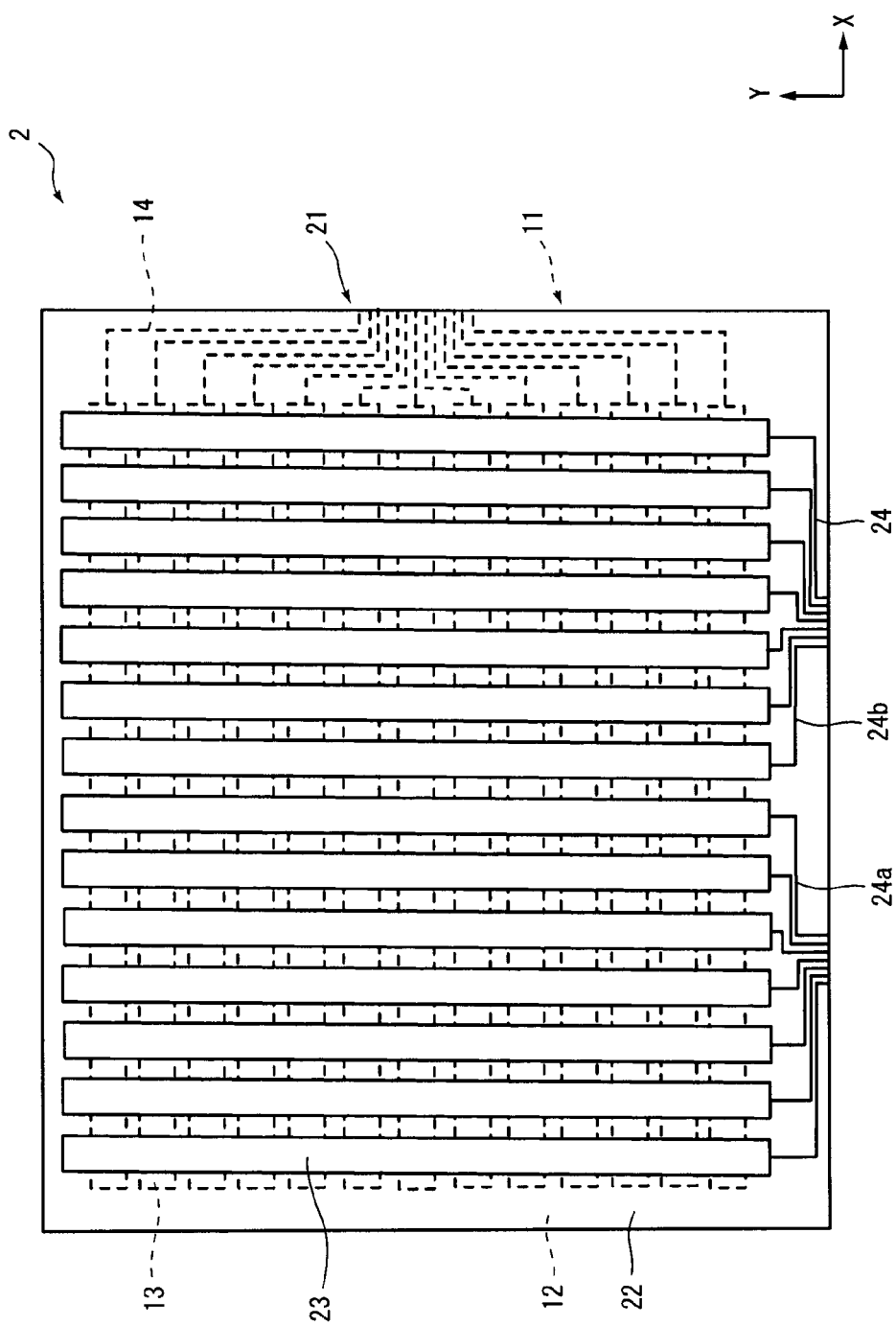
FIG. 2 is a schematic plan view of the touch panel.

The panel body 2a of the touch panel 2 includes two panel portions stacked on top of each other in its thickness direction. More specifically, as shown in FIG. 2, the panel body 2a includes an X-direction touch panel portion 11 having a plurality of X-direction electrodes 13 extending in the X direction, and a Y-direction touch panel portion 21 having a plurality of Y-direction electrodes 23 extending in the Y direction. In the present embodiment, as shown in FIG. 1, these panel portions are stacked on top of each other, beginning from the bottom in the order of X-direction touch panel portion 11 and then Y-direction touch panel portion 21 in the thickness direction thereof.

In the touch panel 2 of the present embodiment, the X-direction touch panel portion 11 and Y-direction touch panel portion 12 are stacked on top of each other in the thickness direction thereof such that the X-direction electrodes 13 cross the Y-direction electrodes 23, as shown in FIG. 2. Further, in the present embodiment, a predetermined voltage is applied to the X-direction electrodes 12. Thus, when a finger or the like of the operator comes in touch with the panel body 2a of the touch panel 2, the electrostatic capacitance between an X-direction electrode 13 and Y-direction electrode 23 at that contact location changes. As described further below in detail, this change in electrostatic capacitance is supplied to the touch panel controller 5 in the form of a signal from the Y-direction electrode 23 to allow the touch panel controller 5 to determine the touch position.

In the present embodiment, the panel body 2a of the touch panel 2 is constructed from two panels stacked on top of each other in the thickness direction thereof; however, the present invention is not limited to such a construction, and a layer of X-direction electrodes and a layer of Y-direction electrodes may be stacked on each other in the thickness direction thereof inside a single panel.

As shown in FIG. 2, the X-direction touch panel portion 11 includes a touch panel substrate 12 made of resin and generally rectangular X-direction electrodes 13 (indicated by broken lines in FIG. 2) on the touch panel substrate 12 extending in the X direction. The touch panel substrate 12 is generally rectangular in shape, with its long sides extending in the X direction. A plurality of parallel X-direction electrodes 13 are arranged in the Y direction on the touch panel substrate 12. That is, the X-direction electrodes 13 extend in the longitudinal direction of the touch panel substrate 12.

The X-direction touch panel portion 11 further includes a plurality of lead lines 14 (i.e. lines) provided on the touch panel substrate 12 and electrically connected with the X-direction electrodes 13. Each of the lead lines 14 has one end connected with one of the ends of an X-direction electrode 13 disposed in its longitudinal direction. The lead lines 14 are provided on the touch panel substrate 12 such that they have the other ends gathered at one location toward one of the ends of the touch panel substrate 12 disposed in its longitudinal direction.

As shown in FIG. 1, a flexible print substrate (hereinafter referred to as FPC) 31 is connected with the other ends of the lead lines 14 provided on the touch panel substrate 12, i.e. the one of the ends of the touch panel substrate 12 disposed in its longitudinal direction. Although not shown, the FPC 31 includes a flexible substrate made of resin that has a plurality of lines corresponding to the lead lines 14. The FPC 31 is also electrically connected with the touch panel controller 5, described below.

As shown in FIG. 2, the Y-direction touch panel portion 21 includes a touch panel substrate (i.e. substrate) 22 made of resin and generally rectangular Y-direction electrodes 23 on the touch panel substrate 22 extending in the Y direction. Similar to the touch panel substrate 12 of the X-direction touch panel portion 11, the touch panel substrate 22 is generally rectangular in shape with its long sides extending in the X direction. A plurality of parallel Y-direction electrodes 23 are arranged in the X direction on the touch panel substrate 22. That is, the Y-direction electrodes 23 extend toward one long side of the touch panel substrate 22.

The Y-direction touch panel portion 21 further includes a plurality of lead lines 24 (i.e. substrate lines, lines) provided on the touch panel substrate 22 and electrically connected with the Y-direction electrodes 23. Each of the lead lines 24 has one end connected with one of the ends of a Y-direction electrode 23 disposed in its longitudinal direction. The lead lines 24 are provided on the touch panel substrate 22 such that they have the other ends gathered at two separate locations toward one long side of the touch panel substrate 22.

As the other ends of the lead lines 24 connected with the Y-direction electrodes 23 of the touch panel substrate 22 are gathered at two separate locations, the space required to accommodate the lead lines 24 is smaller than when all of them are gathered at a single location. That is, if the plurality of lead lines 24 are to be gathered at a single location, the plurality of lead lines 24 must be disposed parallel near one long side of the touch panel substrate 22, resulting in a touch panel substrate 22 with large short sides. This means a touch panel substrate 22 with a large region where the Y-direction electrodes 23 are not present (i.e. picture frame region), increasing the size of the substrate itself.

On the other hand, if the lead lines 24 are gathered at two separate locations, the number of lead lines 24 disposed parallel near one long side of the touch panel substrate 22 is smaller than when all of them are gathered at one location. This reduces the length of the short sides of the touch panel substrate 22, reducing the size of the entire Y-direction touch panel portion 21. However, as the lead lines 24 are gathered at two separate locations, some lead lines, 24a and 24b, are separated from each other at a larger distance, as is apparent from FIG. 2. A larger distance between the lead lines 24a and 24b causes an increase in the variation of noise contained in a signal. This point will be discussed further below.

Figure 4:
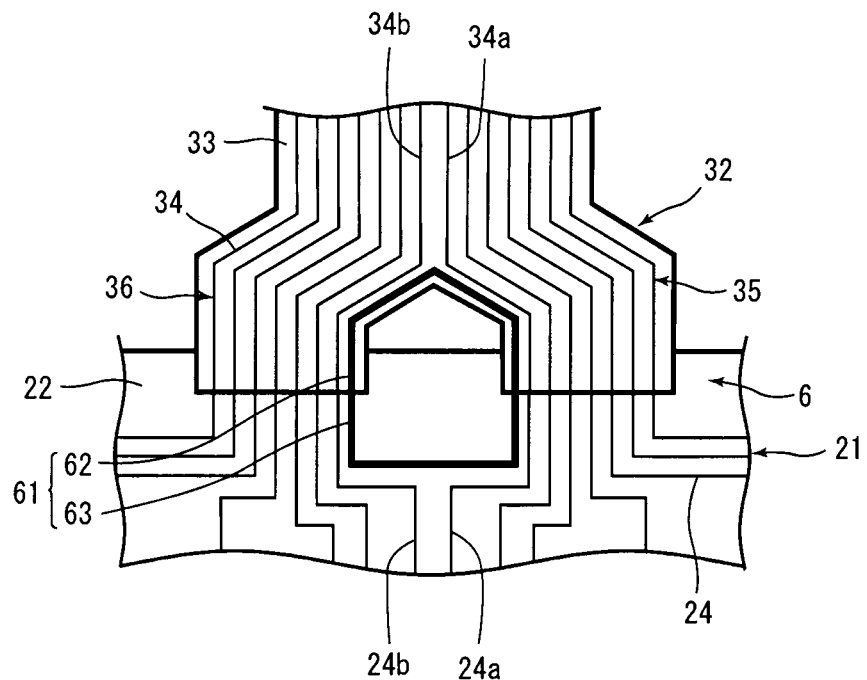
FIG. 4 is an expanded view of the connection between the FPC and the Y-direction touch panel portion.

As shown in FIG. 1, an FPC 32 is connected with the other ends of the lead lines 24 provided on the touch panel substrate 22, i.e. one long side of the touch panel substrate 22. The FPC 32 includes a flexible substrate 33 made of resin and a plurality of connection lines 34 provided on the flexible substrate 33 corresponding to the lead lines 24. As shown in FIG. 4, as the other ends of the lead lines 24 are divided into two groups each gathered at one location on the touch panel substrate 22, the FPC 32 has one end forked into two branches that are to be electrically connected with the respective groups of the other ends of the lead lines. That is, the FPC 32, which has one end forked into two, includes a plurality of connection lines 34 divided into two line groups 35 and 36. Further, the FPC 32 has the other end electrically connected with the touch panel controller 5, described below. The other end of the FPC 32, which is connected with the touch panel controller 5, is not forked into two, and is in the shape of a generally rectangular strip.

In the arrangement described above, two connection lines 34a and 34b, which are adjacent each other at the other end of the FPC 32, are separated at a large distance at the one end of the FPC, where the FPC is forked into two (see FIG. 4). The construction of the lead lines 24 on the touch panel substrate 22 and the FPC 32 will be described in detail further below.

Although not shown, the FPCs 31 and 32 are electrically connected with the touch panel controller 5. That is, the X-direction touch panel portion 11 and Y-direction touch panel portion 21 of the touch panel 2 are electrically connected with the touch panel controller 5. In the present embodiment, the lead lines 24 and connection lines 34 constitute lines 6 connected with the electrodes.

The touch panel controller 5 of the present embodiment applies a predetermined voltage to the X-direction touch panel portion 11 and detects output signals from the Y-direction touch panel portion 21. That is, the touch panel controller 5 detects, as an output signal from the Y-direction touch panel portion 21, a change in the electrostatic capacitance between an X-direction electrode 13 and Y-direction electrode 23 encountered when a finger or the like of the operator touches the panel body 2a of the touch panel 2. Based on the output signal from the Y-direction touch panel portion 21, the touch panel controller 5 determines the touch position on the panel body 2a.

Further, to remove noise contained in a signal provided by the Y-direction touch panel portion 21, the touch panel controller 5 is configured to perform differential noise removal. Differential noise removal involves determining the difference between a signal provided by one electrode and a signal provided by another electrode to remove the noise contained in the signals. The touch panel controller 5 determines the difference between output signals from two adjacent Y-direction electrodes 23 to remove the noise contained in these output signals.

Figure 3:
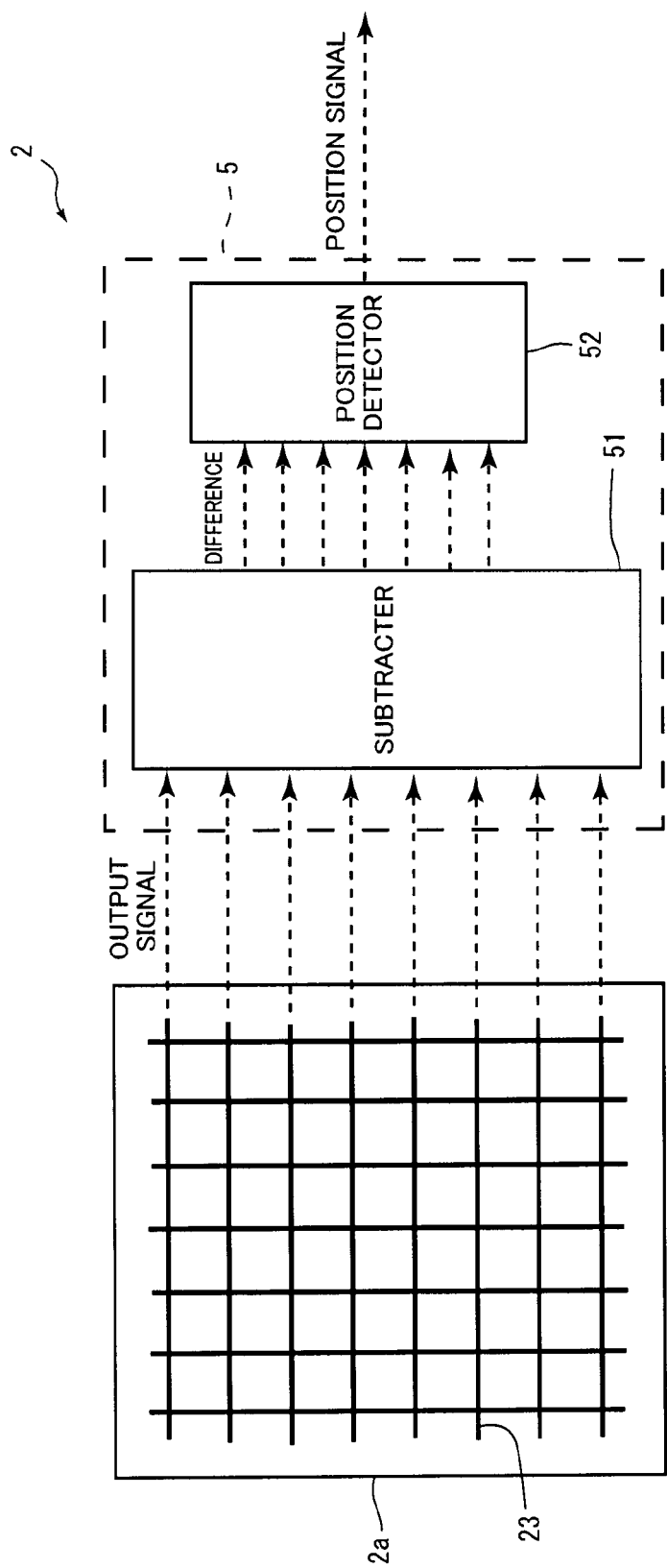
FIG. 3 is a schematic diagram of the touch panel controller.

More specifically, as shown in FIG. 3, the touch panel controller 5 includes a subtracter 51 for determining the difference between signals provided by two adjacent Y-direction electrodes 23 of the Y-direction touch panel portion 21, and a position detector 52 for determining the touch position based on the difference calculated by the subtracter 51.

The subtracter 51 subtracts a signal provided by one Y-direction electrode 23 from a signal provided by an adjacent Y-direction electrode 23 to determine the difference between these signals. This removes noise present in the Y-direction electrodes 23 and, at the same time, determines the increase in the electrostatic capacitance at the touch position in the form of the difference between Y-direction electrodes 23.

Based on the difference determined by the subtracter 51, the position detector 52 detects that the position where the difference rapidly increases is the touch position. When the position detector 52 determines the touch position, it provides the touch position as a positional signal (i.e. detection signal).

(Arrangement for Connection Between Touch Panel Substrate and FPC)

Differential noise cancelling, discussed above is effective when signals transmitted via two lines for which a signal difference is to be determined contain the same level of noise. That is, if not the same level of noise is contained in signals transmitted via the two lines, determining the difference between the signals may not effectively remove the noise contained in the signals.

In the present embodiment, as described above, the lead lines 24 connected with the Y-direction electrodes 23 are gathered at two separate locations, some lead lines 24 are separated at a large distance. That is, as shown in FIG. 2, the lead lines 24a and 24b connected with adjacent Y-direction electrodes 23 are separated at a large distance if the lead line 24a is located at one of the locations and the adjacent lead line 24b is located at the other location.

If two adjacent lead lines 24 are separated at a small distance, any signal noise occurring in them is propagated between these lead lines such that signals transmitted via the two lines contain the same level of noise. However, if the distance between the lead lines 24a and 24b is larger, as described above, noise cannot be easily propagated between the lead lines 24a and 24b. This increases the variance of noise contained in signals in the adjacent lead lines 24a and 24b, which means that the differential approach discussed above cannot effectively remove the noise.

In the present embodiment, as shown in FIG. 4, a loop-shaped floating electrode 61 is provided at a position where the FPC 32 is connected with the lead lines 24 connected with the Y-direction electrodes 23. This floating electrode 61 is electrically independent from the lead lines 24 and is electrically independent from the connection lines 34 of the FPC 32. Further, the floating electrode 61 of the present embodiment has no voltage applied nor is it grounded.

The floating electrode 61 includes an FPC floating electrode portion 62 provided on the flexible substrate 33 of the FPC 32 and a panel floating electrode portion 63 provided on the touch panel substrate 22 of the Y-direction touch panel portion 21. The FPC floating electrode portion 62 is located where the flexible substrate 33 is forked into two, and is located inwardly of the flexible substrate 33 as measured in the width direction thereof so as to extend along the forked substrate. That is, the FPC floating electrode portion 62 is located within a predetermined distance from the connection lines 34a and 34b. The panel floating electrode portion 63 is located between the lead lines 24a and 24b and within a predetermined distance from the lead lines 24a and 24b and is provided such that it is electrically connected with the FPC floating electrode portion 62 when the FPC 32 is connected with the Y-direction touch panel portion 21. In the present embodiment, when the FPC 32 is connected with the Y-direction touch panel portion 21, the floating electrode 61 is generally pentagonal in shape.

As used herein, predetermined distance means a distance that allows noise to propagate between a line and the floating electrode. More specifically, the predetermined distance is preferably smaller than twice the gap (or pitch) between lines (i.e. the connection lines 34a and 34b and lead lines 24a and 24b in the present embodiment), and more preferably as large as the gap.

Figure 5:
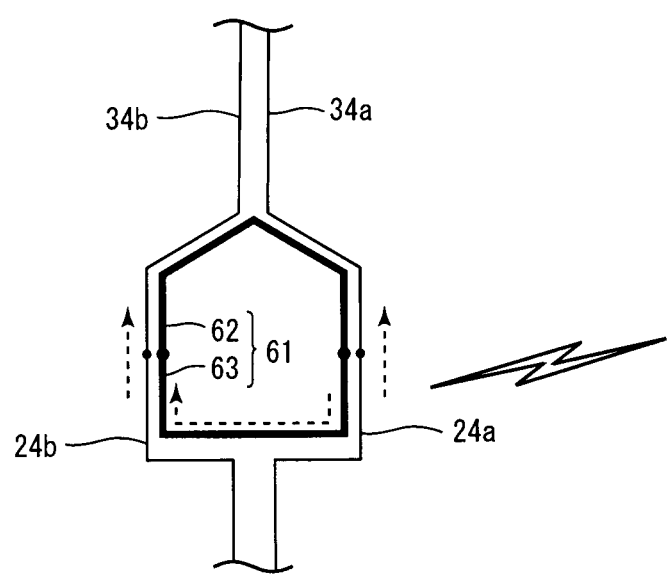
FIG. 5 schematically illustrates the positional relationship between lines and the floating electrode.

This floating electrode 61 allows noise produced in one of the lead lines 24a and 24b to be transmitted to the other line through the floating electrode 61. That is, as indicated by arrows with broken lines in FIG. 5, noise produced in one of the lines (i.e. lead line 24a) is transmitted to the floating electrode 61 by dielectric effects. As discussed above, the floating electrode 61 is electrically independent from the other lines (i.e. lead lines 24a and 24b) such that noise can be propagated from the floating electrode 61 by dielectric effects to reach the other line (i.e. lead line 24b), located within the predetermined distance from the floating electrode.

Thus, the floating electrode 61 ensures that the same level of noise is contained in signals transmitted in the separated lead lines 24a and 24b. Thus, the above differential approach effectively removes signal noise.

Further, the above floating electrode 61 allows noise produced in one of the connection lines 34a and 34b of the FPC 32 to be transmitted to the other line via the floating electrode 61, as is the case with the noise in the lead line 24a or 24b. Thus, the above differential approach effectively removes noise produced in the FPC 32.

The floating electrode 61 has a substantially uniform width throughout the circumference. Further, the floating electrode 61 has a width substantially equal to the width of the lead lines 24a and 24b. Further, in the FPC floating electrode portion 62 of the floating electrode 61, the left and right lengths between the branch position of the FPC 32 and the positions where the connection lines 34a and 34b become generally parallel in FIG. 4 (i.e. the lengths of the diagonal portions in the drawing) are equal to each other. Further, the minimum distances between the floating electrode 61 and the lead lines 24a and 24b and connection lines 34a and 34b are equal to each other.

Thus, the propagation characteristics of signal noise in the left portion of the floating electrode 61 with respect to the branch position are the same as those in the right portion of the floating electrode. Thus, the floating electrode 61 further ensures that the same level of noise is contained in signals in the lead lines 24a and 24b and in signals in the connection lines 34a and 34b.

Some portions of the floating electrode 61 may have a different width from the others, or the lengths from the branch position of the FPC 32 to the lead lines 24a and 24b may be different. Further, the minimum distances between the floating electrode 61 and lead lines 24a and 24b and connection lines 34a and 34b may be different.

Effects of Embodiment 1

The present embodiment provides a floating electrode 61 between separated lead lines 24a and 24b on the touch panel substrate 22 and electrically independent from these lead lines 24a and 24b, located within a predetermined distance from these lines. This allows noise produced in one of the lead lines to be propagated via the floating electrode 61 to reach the other lead line.

Further, the present embodiment provides the floating electrode 61 at the forked end of the FPC 32 and between the separated connection lines 34a and 34b within a predetermined distance from these lines. Thus, noise produced in one of the connection line is propagated via the floating electrode 61 to reach the other connection line.

Moreover, the floating electrode 61 is loop-shaped so as to be located in the Y-direction touch panel portion 21 and FPC 32. Thus, signal noise produced in any one of the lead lines 24a and 24b on the Y-direction touch panel portion 21 and the connection lines 34a and 34b of the FPC 32 can be propagated via the floating electrode 61 to reach another line.

Thus, the differential approach effectively removes noise contained in signals.

Embodiment 2

Figure 6:
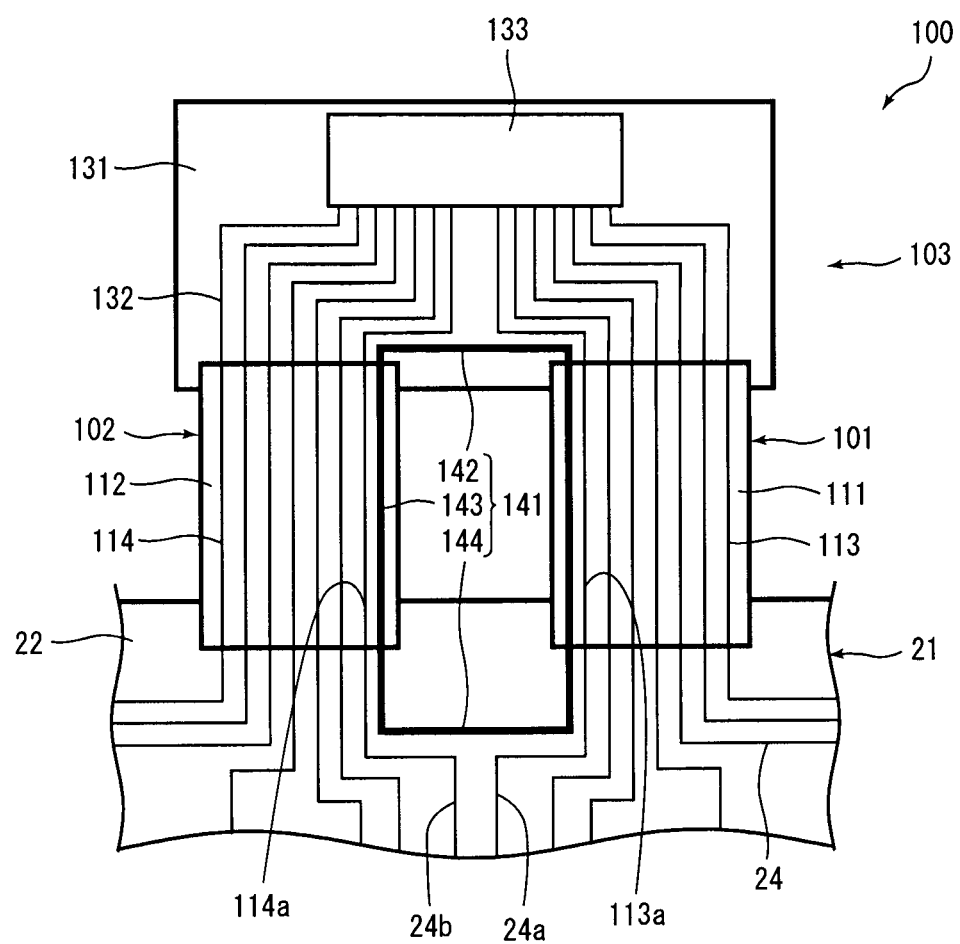
FIG. 6 is an enlarged plan view of the connection between the touch panel controller, FPC and Y-direction touch panel portion of a touch panel according to Embodiment 2.

FIG. 6 schematically shows a touch panel 100 according to Embodiment 2 of the present invention. This embodiment is different from Embodiment 1 in that a touch panel controller 103 is electrically connected with the Y-direction touch panel portion 21 via two FPCs 101 and 102. In the following description, the components that are the same as the corresponding ones of Embodiment 1 are labeled with the same reference numerals and will not be described, and only the differences from Embodiment 1 will be described.

As shown in FIG. 6, the touch panel controller 103 includes a controller substrate 131 made of resin, a plurality of controller lines 132 (i.e. lines) provided on the controller substrate 131, and a controller element 133 mounted on the controller substrate 131. The controller element 133 is electrically connected with the plurality of controller lines 132. The controller element 133 functions as a controller for controlling the operation of the touch panel 100. Similar to the lead lines 24 of the Y-direction touch panel portion 21, the plurality of controller lines 132 are provided on the controller substrate 131 such that each of them has one end and the other end, the one ends being gathered at two separate locations. The plurality of controller lines 132 provided on the controller substrate 131 of the touch panel controller 103 are electrically connected with the respective lead lines 24 provided on the Y-direction touch panel portion 21 via two FPCs 101 and 102.

The FPCs 101 and 102 are generally rectangular in shape. Similar to the FPC 32 of Embodiment 1, each of the FPCs 101 and 102 includes a flexible substrate 111 or 112 made of resin and a plurality of connection lines 113 or 114 (i.e. lines) provided on the flexible substrate 111 or 112. The connection lines 113 and 114 are provided on the generally rectangular flexible substrates 111 and 112 in the form of straight lines. The connection lines 113 and 114 electrically connect the lead lines 24 of the Y-direction touch panel portion 21 with the controller lines 132 of the touch panel controller 103.

As shown in FIG. 6, the FPCs 101 and 102 are separated from each other. Thus, the connection lines 113a of the FPC 101 are separated from the connection lines 114a of the FPC 102. As such, noise produced in a connection line of one group cannot easily be propagated to reach a connection line of the other group. This may cause a difference in the level of signal noise between two adjacent lines such that the differential approach may not effectively remove noise of the signals.

To address this, the present embodiment provides a generally rectangular floating electrode 141 located in the Y-direction touch panel portion 21, FPCs 101 and 102 and touch panel controller 103. That is, the floating electrode 141 is loop-shaped. More specifically, the floating electrode 141 includes a controller floating electrode portion 142 provided on the touch panel controller 103, FPC floating electrode portions 143 provided on the FPCs 101 and 102, and a panel floating electrode portion 144 provided on the Y-direction touch panel portion 21.

The controller floating electrode 142 is located on the controller substrate 131 between controller lines 132a and 132b and within a predetermined distance from the controller lines 132a and 132b. The FPC floating electrode portions 143 are provided on the flexible substrates 111 and 112 so as to be located between connection lines 113a and 114a and within a predetermined distance from the connection lines 113a and 114a when the touch panel controller 103 is connected with the Y-direction touch panel portion 21 via the FPCs 101 and 102. The panel floating electrode portion 144 is provided on the touch panel substrate 22 so as to be located between lead lines 24a and 24b and within a predetermined distance from the lead lines 24a and 24b. Predetermined distance is defined similarly to that of Embodiment 1.

The controller floating electrode portion 142, FPC floating electrode portions 143 and panel floating electrode portion 144 are provided such that they are electrically connected when the touch panel controller 103 is connected with the Y-direction touch panel portion 21 via the FPCs 101 and 102. Electrically connecting the controller floating electrode portion 142, FPC floating electrode portions 143 and panel floating electrode portion 144 forms the loop-shaped floating electrode 141.

Thus, in the Y-direction touch panel portion 21, FPCs 101 and 102 and touch panel controller 103, noise produced in one of two adjacent lines is propagated through the floating electrode 141 to reach the other line. This further ensures that the same level of noise is present in two adjacent lines in the Y-direction touch panel portion 21, FPCs 101 and 102 and touch panel controller 103. Thus, the differential approach removes noise in signals more effectively.

Effects of Embodiment 2

In the present embodiment, the Y-direction touch panel portion 21 is electrically connected with the touch panel controller 103 via two generally rectangular FPCs 101 and 102. Further, a generally rectangular floating electrode 141 is provided so as to be located in the Y-direction touch panel portion 21, FPCs 101 and 102 and touch panel controller 103 and located between two adjacent lines and within a predetermined distance from these lines.

Thus, the same level of signal noise is present in two adjacent lines in the Y-direction touch panel portion 21, FPCs 101 and 102 and touch panel controller 103. Thus, differential reading effectively removes noise in signals.

Moreover, as the floating electrode 141 is located in the Y-direction touch panel portion 21, FPCs 101 and 102 and touch panel controller 103, the floating electrode 141 ensures that the same level of noise is present in two adjacent lines, regardless of in which of the Y-direction touch panel portion 21, FPCs 101 and 102 and touch panel controller 103 noise is produced. Thus, the differential approach removes noise produced in a line of the touch panel 100.

Further, as the Y-direction touch panel portion 21 and touch panel controller 103 are connected via two FPCs 101 and 102 in the present embodiment, the FPC need not be forked into two as in Embodiment 1. Thus, FPCs of a simple shape is used, reducing the manufacturing cost.

Embodiment 3

Figure 7:
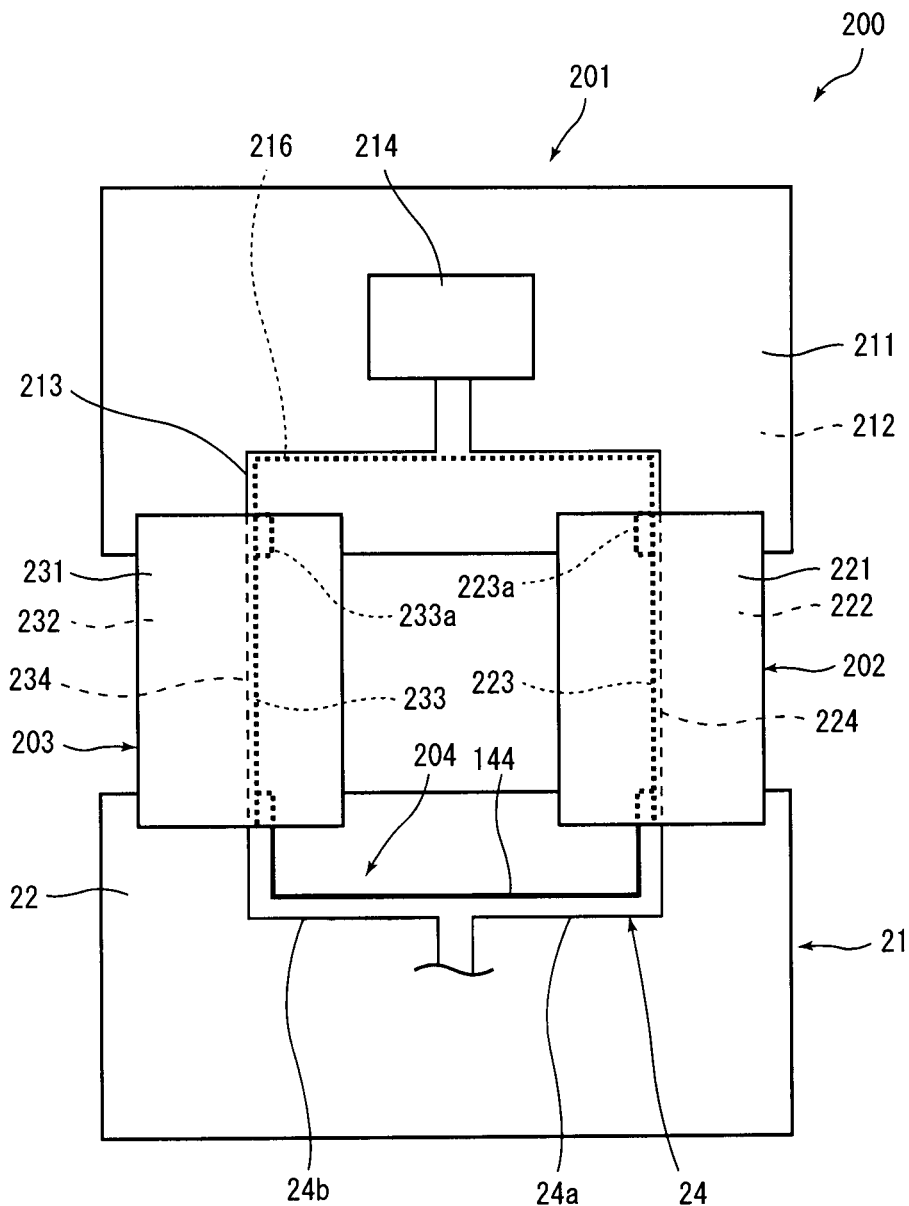
FIG. 7 is a schematic plan view of the touch panel controller, FPC and Y-direction touch panel portion of a touch panel according to Embodiment 3.
Figure 8:
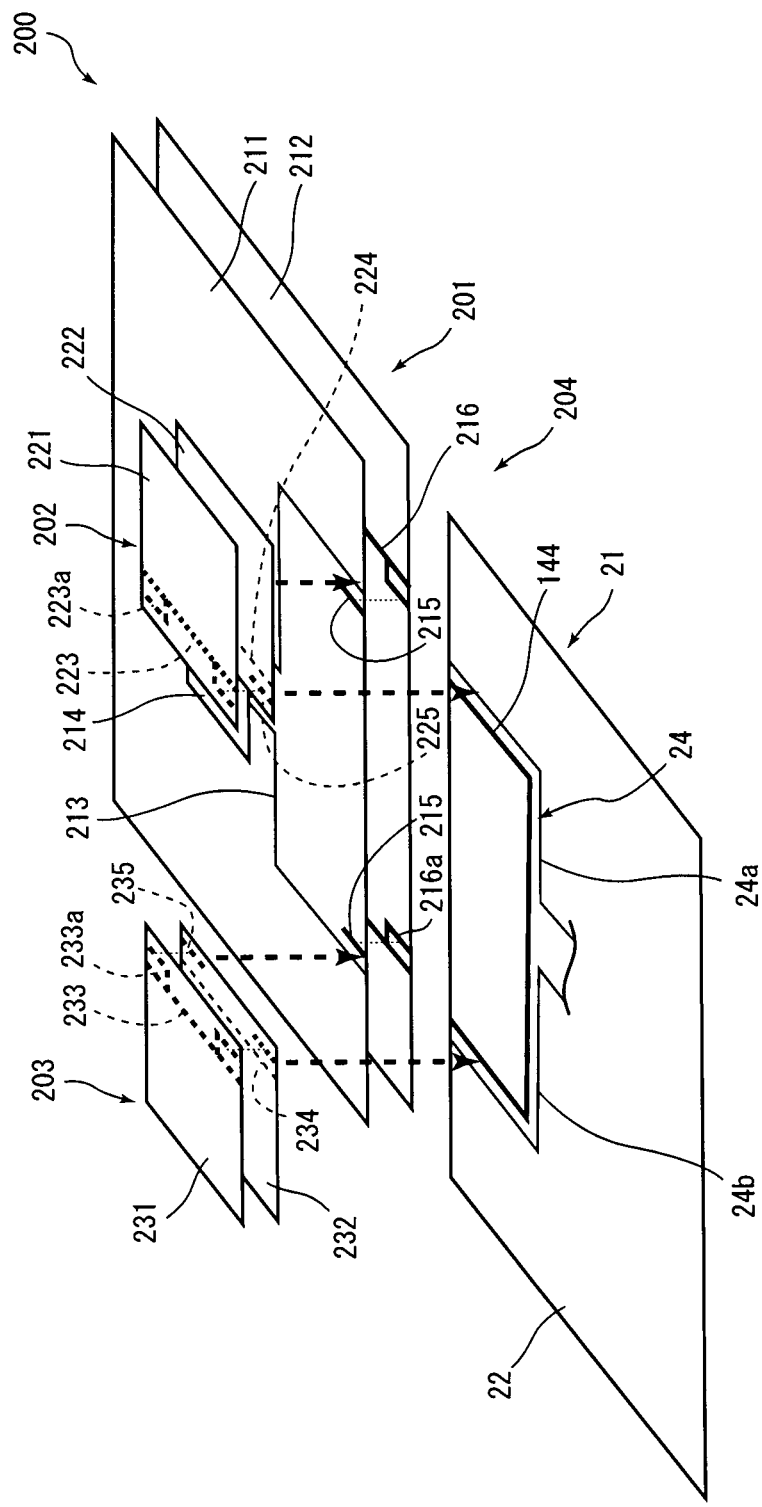
FIG. 8 is an exploded perspective view of the connection between the touch panel controller, FPC and Y-direction touch panel portion of the touch panel according to Embodiment 3.

FIGS. 7 and 8 schematically illustrate a touch panel 200 of Embodiment 3 of the present invention. The present embodiment is different from Embodiment 1 in that a floating electrode 204 is disposed relative to connection lines 224 and 234 of FPCs 202 and 203 and a controller line 213 of a touch panel controller 201 in the thickness direction of flexible substrates 221, 222, 231 and 232 and controller substrates 211 and 212. In the following description, the components that are the same as the corresponding ones of Embodiment 1 or 2 are labeled with the same reference numerals and will not be described, and only the differences from Embodiment 1 or 2 will be described.

As shown in FIG. 7, in this embodiment, as is the case in Embodiment 2, the Y-direction touch panel portion 21 is electrically connected with the touch panel controller 201 via two FPCs 202 and 203. Further, as is the case in Embodiment 2, a panel floating electrode portion 144 is provided on the Y-direction touch panel portion 21 so as to be located on the touch panel substrate 22 between lead lines 24a and 24b.

As shown in FIG. 8, the touch panel controller 201 is formed by stacking two control substrates 211 and 212 in the thickness direction thereof. The upper side of the upper control substrate 211 has a controller line (i.e. line) 213 provided thereon and has a controller element 214 mounted thereon (see FIGS. 7 and 8).

Further, floating electrode connecting portions 215 are provided on the controller substrate 211 near their connections with the FPCs 202 and 203. The floating electrode connecting portions 215 are located in the region defined by the controller line 213 and near the controller line 213. Further, the floating electrode connecting portions 215 are electrically connected with controller floating electrodes 216 provided on the lower controller substrate 212 via a through-hole (schematically indicated by fine broken lines in FIG. 8). That is, each of the floating electrode connecting portions 215 electrically connects the FPC 202 or 203 with the controller substrate 212.

As shown in FIG. 8, the upper side of the lower controller substrate 212 has a controller floating electrode portion 216 provided thereon. This controller floating electrode 216 is located to overlie the controller line 213 provided on the upper controller substrate 211 when the two controller substrates 211 and 212 are stacked on each other in the thickness direction thereof (see FIG. 7). That is, in the present embodiment, the controller floating electrode portion 216 is located relative to the controller line 213 in the thickness direction of the controller substrates 211 and 212. As shown in FIG. 7, the controller floating electrode portion 216 is generally C-shaped as viewed in the thickness direction of the controller substrates 211 and 212 (see thick broken lines of FIG. 7).

As shown in FIG. 8, the controller floating electrode portion 216 includes through-hole connecting portions 216a each electrically connected with one of the floating electrode connecting portions 215 via a through-hole. Each through-hole connecting portion 216a is provided to partly overlie an electrode connecting portion 215 when the two controller substrates 211 and 212 are stacked on each other in the thickness direction thereof.

The controller substrate 212 has such a thickness that the distance between the controller line 213 and the controller floating electrode portion 216 is within a predetermined distance. As is the case in Embodiments 1 and 2, predetermined distance means a distance that allows noise to be propagated between a line and an electrode.

Similar to the touch panel controller 201, each of the FPCs 202 and 203 is formed by stacking two flexible substrates in the thickness direction thereof. The FPCs 202 and 203 have the same construction except that they are mirror images of each other; thus, only the FPC 202 will be discussed in the following description.

The FPC 202 is formed by stacking two flexible substrates 221 and 222 made of resin in the thickness direction thereof. The lower side of the upper flexible substrate 221 has an FPC floating electrode portion 223 provided thereon. This FPC floating electrode portion 223 is generally in the shape of a straight line and extends in the longitudinal direction of the FPC 202 (i.e. in the direction in which the Y-direction touch panel portion 21 and the touch panel controller 201 are connected).

The FPC floating electrode portion 223 includes through-hole connecting portions 223a that are each to be electrically connected via a through-hole with a floating electrode connecting portion 225, discussed below, provided on the lower flexible substrate 222. The through-hole connecting portions 223a are provided at the locations where the FPC 202 is connected with the Y-direction touch panel portion 21 and touch panel controller 201.

The lower side of the lower flexible substrate 222 has a connection line (i.e. line) 224 provided thereon, generally in the shape of a straight line. The connection line 224 is located to overlie the FPC floating electrode portion 223 when the two flexible substrates 221 and 222 are stacked on each other in the thickness direction thereof. Further, the connection line 224 is located to contact the controller line 213 of the FPC 202 and a lead line 24 of the Y-direction touch panel portion 21 when the FPC 202 is connected with the Y-direction touch panel portion 21 and touch panel controller 201 (see FIG. 7).

Further, as shown in FIG. 8, the lower side of the flexible substrate 222 has floating electrode connecting portions 225 provided thereon. The floating electrode connecting portions 225 are provided at both ends of the flexible substrate 222 disposed in its longitudinal direction. Each of the floating electrode connecting portions 225 is electrically connected with one of the through-hole connecting portions 223a of the flexible substrate 221 through a through-hole. One of the floating electrode connecting portions 225 contacts one of the floating electrode connecting portions 215 of the touch panel controller 201 when the FPC 202 is connected with the touch panel controller 201. The other one of the floating electrode connecting portions 225 contacts the floating electrode 144 of the Y-direction touch panel portion 21 when the FPC 202 is connected with the Y-direction touch panel portion 21.

The flexible substrate 222 has such a thickness that the distance between the connecting line 224 and FPC floating electrode portion 223 is within a predetermined distance. As is the case in the controller substrate 212, predetermined distance means a distance that allows noise to be propagated between a line and an electrode.

As the Y-direction touch panel portion 21 is connected with the touch panel controller 201 via the FPC 202, a lead line 24 of the Y-direction touch panel portion 21 is electrically connected with the controller line 213 of the touch panel controller 201 via the connection line 224 of the FPC 202. Further, the floating electrode portion 144 of the Y-direction touch panel portion 21 is electrically connected with the controller floating electrode portion 216 of the touch panel controller 201 via the floating electrode connecting portions 225 and FPC floating electrode portion 223 of the FPC 202 and the floating electrode connecting portion 215 of the touch panel controller 201.

In FIGS. 7 and 8, numerals 231 and 232 indicate two flexible substrates constituting the FPC 203. Numeral 233 indicates an FPC floating electrode portion, numeral 233a through-hole connecting portions, numeral 235 a floating electrode connecting portion, and numeral 234a connecting line.

The controller floating electrode portion 216, floating electrode connecting portions 215, FPC floating electrode portions 223 and 233 and panel floating electrode portion 144 constitute the floating electrode 204.

In the present embodiment, the touch panel controller 201 and FPCs 202 and 203 each have a two-layer construction; however, the present embodiment is not limited to such an arrangement, and the Y-direction touch panel portion 21 may also have a two-layer construction where the floating electrode 144 is located relative to the lead line 24 in the thickness direction of the touch panel substrate 22.

Effects of Embodiment 3

The present embodiment provides, in the touch panel controller 201 and FPCs 202 and 203, a controller floating electrode portion 216 and FPC floating electrode portions 223 and 233 are located relative to the controller line 213 and connection lines 224 in the thickness direction of the controller substrates 211 and 212 and flexible substrates 221, 222, 231 and 232. Thus, the parasitic capacitance formed by capacitive coupling between a line and the floating electrode is larger than the parasitic capacitance formed if the line and floating electrode are located in a plane. That is, as the floating electrode is located relative to a line in the thickness direction of the substrate in the present embodiment, capacitive coupling occurs in the region in the shape of a flat plate formed between the line and floating electrode, such that the parasitic capacitance formed between the line and floating electrode is larger than the parasitic capacitance formed between a line and the floating electrode in a single plane. Thus, the arrangement of the present embodiment allows signal noise to be effectively propagated between a line and the floating electrode. Thus, the same level of signal noise is present in two adjacent lines.

Embodiment 4

Figure 9:
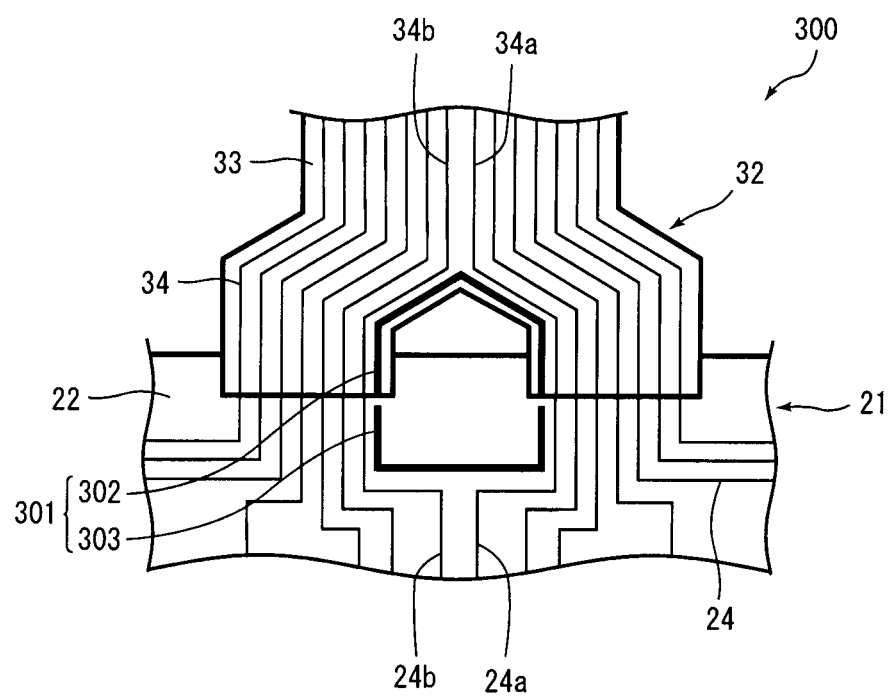
FIG. 9 is an enlarged plan view of the connection between the FPC and Y-direction touch panel portion of a touch panel according to Embodiment 4.

FIG. 9 schematically illustrates a touch panel 300 according to Embodiment 4 of the present invention. The present embodiment is different from Embodiment 1 in that a floating electrode 301 is divided into a portion on an FPC 32 and a portion on a Y-direction touch panel portion 21. In the flowing description, the components that are the same as the corresponding ones of Embodiment 1 are labeled with the same reference numerals and will not be described, and only the differences will be described.

As shown in FIG. 9, a floating electrode 301 is provided at the connection between the FPC 32 and Y-direction touch panel portion 21. As is the case in Embodiment 1, the floating electrode 301 is located on the FPC 32 and Y-direction touch panel portion 21 and located between lead lines 24a and 24b of the Y-direction touch panel portion 21 and between connection lines 34a and 34b of the FPC 32.

More specifically, the floating electrode 301 includes an FPC floating electrode portion 302 provided on the FPC 32 and a panel floating electrode portion 303 provided on the Y-direction touch panel portion 21. The FPC floating electrode portion 302 is provided on the flexible substrate 33 of the FPC 32 so as to extend along the connection lines 34a and 34b within a predetermined distance from the connection lines 34a and 34b. That is, the FPC floating electrode portion 302 is located where the FPC 32 is forked into two, and is located inwardly of the flexible substrate 33 as measured in the width direction thereof so as to extend along the forked flexible substrate 33.

The panel floating electrode portion 303 is located on the touch panel substrate 22 and located between the lead lines 24a and 24b and within a predetermined distance from these lines. Thus, the panel floating electrode 303 is generally C-shaped.

In the present embodiment, the FPC floating electrode portion 302 and panel floating electrode portion 303 are not electrically connected. That is, the FPC floating electrode portion 302 and panel floating electrode portion 303 are electrically independent from each other.

Figure 10:
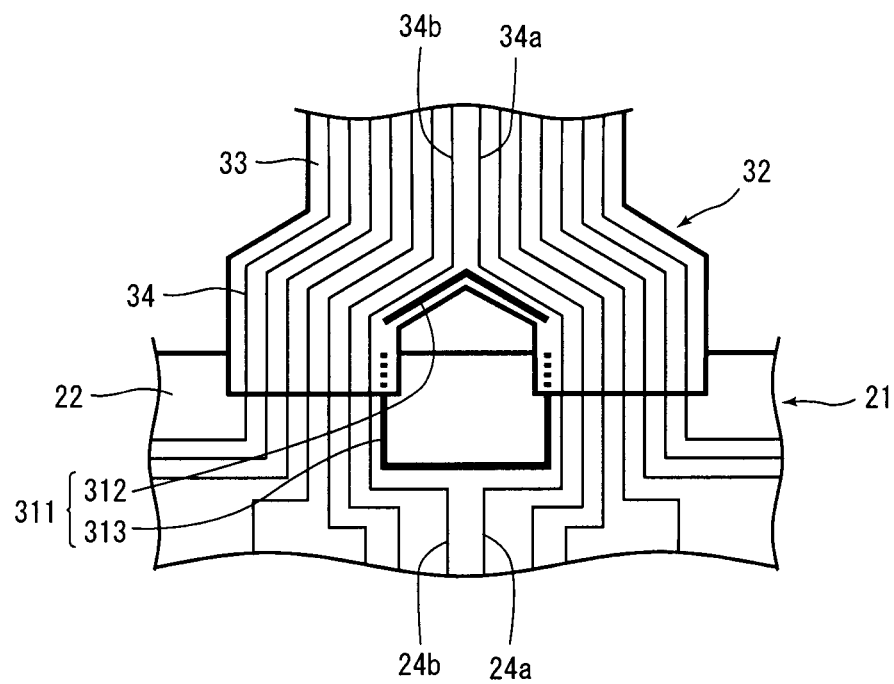
FIG. 10 is a view of another exemplary arrangement for the touch panel according to Embodiment 4, similar to FIG. 9.

Instead of the arrangement of FIG. 9, the FPC floating electrode portion and panel floating electrode portion may be in the arrangement of FIG. 10. That is, the FPC 32 may have an FPC floating electrode 312 extending in two directions only in the area where the FPC is forked, while the Y-direction touch panel portion 21 may have a generally C-shaped panel floating electrode portion 313 extending up to the periphery of the touch panel substrate 22. A floating electrode 311 having an FPC floating electrode portion 312 and a panel floating electrode portion 313 in such an arrangement achieves the same effects of the arrangement of FIG. 9 described above.

Effects of Embodiment 4

In the present embodiment, the floating electrode 301 is divided into a portion on the FPC 32 and a portion on the Y-direction touch panel portion 21. Thus, separate floating electrode portions for the FPC 32 and Y-direction touch panel portion 21 may be fabricated, and it is not necessary to form a loop-shaped floating electrode with its portions being electrically connected when the FPC 32 is connected with the Y-direction touch panel portion 21. Thus, a touch panel with a floating electrode may be fabricated in a simple manner.

Further, in the present embodiment, the portions of the FPC 32 where it is connected with the Y-direction touch panel portion 21 (i.e. the straight portions into which the FPC is forked in FIGS. 9 and 10) may have a smaller length. Thus, the size of the FPC 32 may be reduced, reducing the manufacturing cost.

Other Embodiments

Although embodiments of the present invention have been described, these embodiments are merely examples that may be used to carry out the present invention. Thus, the present invention is not limited to these embodiments, and may be carried out with appropriate modifications to the embodiments without departing from the spirit of the invention.

In each of the above embodiments, a floating electrode 61, 141, 204, 301, 311 is provided to be located in the FPC 32 and Y-direction touch panel portion 21 or located in the touch panel controller 103, 210 and FPCs 101, 102, 202, 203 and Y-direction touch panel portion 21. Alternatively, a floating electrode may be located in at least one of the touch panel controller, FPC and Y-direction touch panel portion. When noise enters areas where the floating electrode is provided, noise may be propagated through the floating electrode to reach an adjacent line such that the same level of noise is present.

In each of the above embodiments, a floating electrode is provided at each of two locations where lead lines 24 of the Y-direction touch panel portion 21 are gathered. However, the present invention is not limited to such an arrangement, and floating electrodes may be provided in any arrangement where lines for which the difference of output signals are determined at two or more locations. For example, if the difference between output signals of the lead lines of the X-direction touch panel portion is to be determined, these lead lines may be gathered at two locations and floating electrodes may be provided for this arrangement.

In each of the above embodiments, X-direction electrodes 13 and Y-direction electrodes 23 of the panel body 2a of the touch panel 2 are generally rectangular in shape. Alternatively, the X-direction electrodes and Y-direction electrodes may be in other shapes; for example, they may be diamond-shaped.

In each of Embodiments 1 to 3, a continuous floating electrode 61, 141, 204 is provided in the touch panel controller 103, 210, FPC 32, 101, 102, 202, 203 and Y-direction touch panel portion 21. Alternatively, the floating electrode may be divided or maybe constructed from insular portions.

INDUSTRIAL APPLICABILITY

The touch panel of the present invention is useful as a touch panel including a plurality of lines connected with a plurality of electrodes provided on a substrate.

The invention claimed is:

1. A touch panel comprising:
   a substrate;
   a plurality of electrodes on the substrate;
   a plurality of lines each electrically connected to one of the plurality of electrodes;
   a controller that determines a difference between a signal provided by at least one line of the plurality of lines and a signal provided by another line adjacent the at least one line of the plurality of lines; and
   a loop-shaped floating electrode including portions which touch or cross over each other to define a loop, the loop-shaped floating electrode located within a predetermined distance from the at least one line and the other line and electrically independent from the plurality of lines such that noise produced in the at least one line can be propagated to reach the another line.

2. The touch panel according to claim 1, further comprising:
   a connecting portion that electrically connects the substrate with the controller, wherein
   each of the plurality of lines includes a substrate line provided on the substrate and electrically connected with one of the plurality of electrodes, a connection line provided on the connecting portion, and a controller line provided in the controller,
   the substrate line, the connection line and the controller line are electrically connected, and
   the floating electrode is located within the predetermined distance from at least one line out of the substrate line, the connection line and the controller line, and another line adjacent the at least one line out of the plurality of lines.

3. The touch panel according to claim 2, wherein the floating electrode is located in the substrate, the connecting portion and the controller.

4. The touch panel according to claim 2, wherein the floating electrode is located to at least partly overlap at least one line out of the substrate line, the connection line and the controller line and another line adjacent the at least one line out of the plurality of lines, as viewed in a thickness direction of the substrate.

* * * * *